United States Patent [19]
Carpentier

[11] Patent Number: 5,557,237
[45] Date of Patent: Sep. 17, 1996

[54] METHOD AND DEVICE FOR AUTOMATIC GAIN CONTROL IN AN AMPLIFIER OF AN ELECTROACOUSTIC SYSTEM, PARTICULARLY FOR MOTOR VEHICLES

[75] Inventor: Claude B. Carpentier, Neuilly-sur-Seine, France

[73] Assignee: S L X, France

[21] Appl. No.: 406,850

[22] PCT Filed: Sep. 21, 1993

[86] PCT No.: PCT/FR93/00905

§ 371 Date: Mar. 22, 1995

§ 102(e) Date: Mar. 22, 1995

[87] PCT Pub. No.: WO94/07306

PCT Pub. Date: Mar. 31, 1994

[30] Foreign Application Priority Data

Sep. 22, 1992 [FR] France .................................. 92 11268

[51] Int. Cl.⁶ ..................................................... H03G 3/30
[52] U.S. Cl. .......................... 330/129; 330/279; 381/107
[58] Field of Search .................................. 330/129, 149, 330/279; 381/86, 103, 107, 120

[56] References Cited

U.S. PATENT DOCUMENTS 4,684,899  8/1987  Carpentier ............................... 330/149
4,864,246  9/1989  Kato et al. .............................. 330/129

FOREIGN PATENT DOCUMENTS 2579388  9/1986  France .
2945783  2/1981  Germany .
4202609  8/1992  Germany .
2050095  12/1980 United Kingdom .
WO90/11666 10/1990 WIPO .

Primary Examiner—Steven Mottola
Attorney, Agent, or Firm—Beveridge, DeGrandi, Weilacher & Young, L.L.P.

[57] ABSTRACT

The invention therefore consists of an automatic gain control method for an amplifier in an electroacoustic system, of the type referred to above, i.e. wherein a first treatment including a first filtering sub-treatment is effected on a complex signal picked up in the listening area by pick-up means such as a microphone and containing a mixture of background noise and sound signals from loudspeakers to obtain a first treated signal, a parallel second treatment including a second filtering sub-treatment is effected on a wanted signal sampled at the output of the variable gain amplifier to obtain a second treated signal, the gain of the amplifier is controlled as a function of the comparative levels of the two treated signals, in accordance with a general feature of the invention each filtering sub-treatment includes first high-pass filtering with a low cut-off frequency and second high-pass filtering with a medium cut-off frequency and an attenuation of at least approximately 30 dB at approximately 100 Hz, also increasing the gain of the amplifier is prevented if the level of the signal sampled on the input side of the first high-pass filtering of the first filtering sub-treatment is less than the product of the level of the corresponding signal sampled on the output side of the first high-pass filtering by a predetermined coefficient greater than 1 or if the level of the signal sampled on the input side of the first high-pass filtering of the second filtering sub-treatment is greater than the product of the level of the corresponding signal sampled on the output side of the first high-pass filtering by a predetermined coefficient greater than 1.

26 Claims, 4 Drawing Sheets

METHOD AND DEVICE FOR AUTOMATIC GAIN CONTROL IN AN AMPLIFIER OF AN ELECTROACOUSTIC SYSTEM, PARTICULARLY FOR MOTOR VEHICLES

The invention concerns automatic control of the gain of a variable gain amplifier in an electroacoustic system as a function of the signal/background noise ratio.

It finds a particularly advantageous application in compensating background noise in audio frequency electroacoustic systems including a variable gain amplifier, in particular multichannel systems, for example systems incorporated in automobile vehicles.

In this field, diverse solutions or attempted solutions have been proposed for a very serious problem inherent to this kind of control device, namely identifying the nature of the signal picked up by the sensor of the device. This signal can be noise produced by the automobile, the signal from the loudspeakers or a combination of the two in varying proportions.

Especially if the sensor is a microphone, the smallest error in discriminating between the signal and the noise causes immediate positive feedback reaction and the system rapidly reaches its maximum gain through a process comparable to the LARSEN effect.

To circumvent this problem it was proposed at the 1988 AES congress to use a sensor in the form of a vibration detector fixed to the automobile bodywork, after establishing some degree of correlation between the noise inside the passenger compartment and the vibration of the bodywork. Apart from the fact that this solution is not ideal because there is only partial correlation, it does not completely eliminate the problem of discriminating the signal from the noise because the sound from the loudspeakers causes vibration in the bodywork which excites the detector.

Other devices use a high order low-pass filter in the circuit for processing the signal picked up by the microphone. This filter has a cut-off frequency of about 15 Hz which effectively eliminates output from the loudspeakers, which are always at a higher frequency. These devices are ineffective in that they also eliminate components of the noise spectrum in the audible frequency domain and retain only inaudible components which are not a problem. For these systems to operate correctly the level of the noise frequencies constituting a problem would have to be proportional to the level of the frequencies below 15 Hz, which is not the case.

A third method widely used in sound reinforcement in public places entails measuring the noise level in the absence of any signal. These systems operate very well if the signal is "chopped" like the human voice, for example, in which there are frequent periods of silence during which the noise level can be measured without error. In the case of music, however, several minutes can go by without any period of silence, and this rules out this type of device for the type of application intended.

In devices intended for use in automobiles the best results are currently obtained in the following manner: a microphone picks up a complex signal made up of the noise produced by the car and the sound from the loudspeakers. This signal is filtered by a high-pass filter to eliminate very low noise frequencies, which are not a problem for the listener, and is then rectified for comparison with the wanted or pure signal sampled on the output side of the variable gain amplifier, filtered by an identical filter and rectified. The comparator is calibrated using pink noise and in the absence of any background noise to obtain comparable voltages from the respective rectifiers of the pure signal channel and the complex signal channel.

The problem encountered with these devices is the non-linear nature of the electroacoustic system comprising the loudspeaker, the listening environment and the microphone. The response curve of the microphone commonly shows 15 dB of variation around a mean level. This 15 dB represents the uncertainty with which these devices distinguish signal from noise. If they are not to confuse the signal and noise, a safety margin of 15 dB must be adopted during setting up, i.e. the comparator which commands an increase in the gain must operate only if the voltage from the microphone channel reaching the comparator is more than 15 dB above the voltage from the pure signal channel.

This safety margin means that the gain increases only if the sound pressure level due to the noise is close on 15 dB greater than that of the signal. If the spectra of the signal and the noise were in the same frequency ranges this type of system would be inoperative because the "sound" of the signal would always be very much lower than that of the noise and the signal would remain inaudible. The noise spectrum of an automobile is rich in low frequencies which have little masking effect on signal frequencies in the audible spectrum, such as human speech, and it is therefore possible to distinguish clearly a signal with background noise at a level 15 dB higher, provided that the frequencies constituting the noise are sufficiently different from those constituting the signal.

The drawback of this type of system is that the noise frequencies used are mainly frequencies which are not especially disturbing for the listener and there often result phenomena known to the person skilled in the art as "overcompensation phenomena", which are interpreted as a malfunction of the system.

Substantial improvements can be achieved by using an equalizer to linearize the electroacoustic system comprising the loudspeaker, the listening environment and the microphone. In this way the safety margin can be reduced to 6 dB. This allows the use of more severe filtering, with a cut-off frequency of 250 Hz and an attenuation of 20 dB at 100 Hz. This reduces the overcompensation phenomena by lowering the sound pressure level of the noise 5 dB below that of the signal when the comparator operates.

Nevertheless, these systems are not suitable for widespread use because, apart from the persistence of an overcompensation phenomenon, they always operate at the limit of stability.

This stability is even more precarious in the case of multichannel systems as usually employed in automobiles. In these devices it is standard practise to sum the voltages on each channel to produce the voltage of the pure signal for comparison. This method requires an additional 10 dB of safety margin.

In an installation with four loudspeakers, if the driver wishes to listen only to the front lefthand speaker, for example because the rest of the family is asleep and he wants to listen to the news, after adjustment of the left/right and front/back balance controls the voltage of the pure signal is only a quarter of what it was with the left/right and front/back balance controls centered, which is a drop of 12 dB. If, as is desirable, the microphone is near the head of the driver and if, as is usual, the front lefthand loudspeaker is at the lefthand end of the dashboard, the signal component reaching the microphone has not been significantly reduced (by only about 2 dB), as it comes primarily from the front lefthand speaker. An imbalance of 10 dB therefore results at the comparator.

Finally, these systems include a threshold detector device the function of which is to prevent any increase in the amplifier gain if the signal level falls below a defined threshold, for example −40 dB. This device prevents an increase in gain between two tracks on a disk but is unable to prevent an unnecessary increase in the gain between two successive words of a speaker talking hesitantly, or in any other similar situation in which the signal level does not drop below the threshold but is temporarily unrepresentative of the level to be taken into account.

For all the above reasons there is at present no automatic volume control device capable of satisfying the in-car entertainment market.

The invention is directed to proposing a more satisfactory solution to this problem.

One object of the invention is to enable automatic control of the amplifier using high-pass filtering with a very restrictive attenuation curve at low frequencies.

Another object of the invention is to propose an unconditionally stable multichannel device which is free of overcompensation phenomena and of unwanted increases in gain at "quasi-gaps", and is therefore suitable for widespread use in the in-car entertainment market.

A further object of the invention is to eliminate instabilities during left/right and front/back balance adjustments in multichannel installations.

The invention therefore consists of an automatic gain control method for an amplifier in an electroacoustic system, of the type referred to above, i.e. wherein a first treatment including a first filtering sub-treatment is effected on a complex signal picked up in the listening area by pick-up means such as a microphone and containing a mixture of background noise and sound signals from loudspeakers to obtain a first treated signal, a parallel second treatment including a second filtering sub-treatment is effected on a wanted signal sampled at the output of the variable gain amplifier to obtain a second treated signal, the gain of the amplifier is controlled as a function of the comparative levels of the two treated signals, in accordance with a general feature of the invention each filtering sub-treatment includes first high-pass filtering with a low cut-off frequency and second high-pass filtering with a medium cut-off frequency and an attenuation of at least approximately 30 dB at approximately 100 Hz, also increasing the gain of the amplifier is prevented if the level of the signal sampled on the input side of the first high-pass filtering of the first filtering sub-treatment is less than the product of the level of the corresponding signal sampled on the output side of the first high-pass filtering by a predetermined coefficient greater than 1 or if the level of the signal sampled on the input side of the first high-pass filtering of the second filtering sub-treatment is greater than the product of the level of the corresponding signal sampled on the output side of the first high-pass filtering by a predetermined coefficient greater than 1.

The problem as stated can instead be solved using an automatic gain control method of the type mentioned above in which, in accordance with the invention, in addition to using first high-pass filtering with a low cut-off frequency and second high-pass filtering with a medium cut-off frequency and an attenuation of at least approximately 30 dB at approximately 100 Hz, an equalizer is provided and adjusted to prevent increase in the gain of the amplifier by any wanted signal the frequency of which is less than or equal to the cut-off frequency of the first high-pass filtering in the absence of noise; this enables lifting of prevention of any increase in the gain of the amplifier when the level of the signal sampled on the input side of the first high-pass filtering of the second filtering sub-treatment is greater than the product of the level of the corresponding signal sampled on the output side of this first high-pass filtering by a predetermined coefficient greater than 1 and continued prevention of any increase in gain only when the level of the signal sampled on the input side of the first high-pass filtering of the first filtering sub-treatment is less than the product of the level of the corresponding signal sampled on the output side of the first high-pass filtering by a predetermined coefficient greater than 1.

It is also possible to solve the problem as stated using an automatic gain control method of the type mentioned above in which, in accordance with the invention, an equalizer is dispensed with, as is prevention of any increase in the gain of the amplifier when the level of the signal sampled on the input side of the first high-pass filtering of the second filtering sub-treatment is greater than the product of the level of the corresponding signal sampled on the output side of this first high-pass filtering by a predetermined coefficient greater than 1.

In this case, and assuming that the electroacoustic system is autostable below the cut-off frequency of the first high-pass filtering, i.e. assuming that there is no resonance in the electroacoustic system liable to render the system unstable, it is sufficient, in accordance with the invention, in addition to using this first high-pass filtering with a low cut-off frequency and second high-pass filtering with a medium cut-off frequency and an attenuation of at least approximately 30 dB at approximately 100 Hz, to prevent any increase in the gain of the amplifier only if the level of the signal sampled on the input side of the first high-pass filtering of the first filtering sub-treatment is less than the product of the level of the corresponding signal sampled on the output side of the first high-pass filtering by a predetermined coefficient greater than 1.

A preferred embodiment of the method of the invention includes a calibration phase in which a pink noise signal is fed to the input of the amplifier and a level adjustment is effected preventing increase in the gain of the amplifier by the first treated signal, allowing for a safety margin between about 1.5 dB and about 4 dB, preferably 2 dB.

After this calibration phase, in normal operation, the gain of the amplifier is increased only if the level of the first treated signal is 2 dB greater than that of the second treated signal.

To very the stability of the electroacoustic system, after the calibration phase using pink noise a variable frequency sinusoidal signal is injected as a pure signal and its frequency is increased, with no background noise, from a starting frequency (for example 20 Hz) to the cut-off frequency of the first high-pass filter (180 Hz in this example). If the system is stable the gain of the amplifier is not increased by the first treated signal.

On the input side of the first high-pass filter of the first filter sub-treatment, the complex signal is filtered by an auxiliary high-pass filter having a cut-off frequency lower than that of the first high-pass filter and the level comparison is effected to decide whether to prevent any increase in the gain of the amplifier between the signal sampled on the output side of this auxiliary filtering and the corresponding signal sampled on the output side of the first high-pass filtering; this ensures correct operation of the device in vehicles generating very low noise frequencies.

To avoid penalizing control performance, for each sampled wanted signal and complex signal present at the input of the corresponding processor systems a decision is taken whether to prevent any increase in the gain before any increase in the gain of the amplifier as a function of the instantaneous signal/noise ratio is effected.

In accordance with another general feature of the invention, more suited to amplifiers with a plurality of input and output channels, the wanted signal is always sampled on the channel carrying the most powerful signal, which eliminates problems of instability during adjustment of left/right and front/back balance.

The invention also consists in an automatic gain control device for an amplifier in an electroacoustic system, including:

means, such as a microphone, for picking up a complex signal containing a mixture of background noise and sound signals from loudspeakers, means for acquiring a wanted signal at the variable gain amplifier output, first means for processing the complex signal incorporating first filter means adapted to deliver a first treated signal, second means for treating the acquired wanted signal incorporating second filter means adapted to deliver a second treated signal, main comparator means for comparing the first and second treated signals adapted to deliver a main comparison signal, and control means adapted to command an increase or a decrease in the gain of the amplifier as a function of the value of the main comparison signal;

in a first variant of the invention the filter means each include a first high-pass filter stage with a low cut-off frequency and a second high-pass filter stage with a medium cut-off frequency and an attenuation of at least approximately 30 dB at approximately 100 Hz; also first auxiliary comparator means are further provided and adapted to compare the respective levels of the signals sampled on the input side and on the output side of the first high-pass filter stage of the first filter means and to deliver a first auxiliary comparison signal having a first value if the level of the signal sampled on the input side of the filter stage is less than the product of the level of the signal sampled on the output side of this stage by a predetermined coefficient greater than 1, and a second value otherwise; second auxiliary comparator means are further provided and adapted to compare the respective levels of the signals sampled on the input side and on the output side of the first high-pass filter stage of the second filter means and to deliver a second comparison signal having a first value if the level of the signal sampled on the input side of the first filter stage is greater than the product of the level of the signal sampled on the output side of this stage by a predetermined coefficient greater than 1, and a second value otherwise; the control means are then adapted to prevent increase in the gain of the amplifier if the first and second auxiliary comparator means deliver their respective first values.

In another variant of the invention, in addition to a first high-pass filter stage with a low cut-off frequency associated with a second high-pass filter stage with a medium cut-off frequency and an attenuation of at least approximately 30 dB at approximately 100 Hz, equalizer means are further provided and set to prevent increase in the gain of the amplifier for any pure (or wanted) signal of frequency less than or equal to the cut-off frequency of the first high-pass filter stage, in the absence of noise, the incorporation of these equalizer means rendering the second auxiliary comparator means superfluous, only the first auxiliary comparator means being retained; the control means are then adapted to prevent increase in the gain of the amplifier if the first auxiliary comparator means deliver their first value.

The equalizer means is advantageously a fixed correction parametric equalizer disposed on the output side of the variable gain amplifier.

In yet another embodiment of the invention it is possible to dispense with an equalizer if the electroacoustic system is autostable. It is then sufficient to provide, in each of the first and second filter means, a first high-pass filter stage with a low cut-off frequency and a second high-pass filter stage with a medium cut-off frequency and an attenuation of at least approximately 30 dB at approximately 100 Hz; in conjunction, the second auxiliary comparator means can be dispensed with, retaining only the first auxiliary comparator means which are adapted to compare the respective levels of the signals sampled on the input side and on the output side of the first high-pass filter stage of the first filter means and to deliver a first auxiliary comparison signal having a first value if the level of the signal sampled on the input side of the filter stage is less than the product of the level of the signal sampled on the output side of this stage by a predetermined coefficient greater than 1, and a second value otherwise, and the control means are then adapted to prevent increase in the gain of the amplifier if the first auxiliary comparator means deliver their first value.

The cut-off frequency of each first high-pass filter stage is advantageously between approximately 150 Hz and approximately 200 Hz, preferably 180 Hz, and the cut-off frequency of each second high-pass filter stage is advantageously between approximately 500 Hz and approximately 2 000 Hz, preferably 1 000 Hz.

In one embodiment of the invention each of the first and second filter means includes a high-pass filter having a slope of approximately 18 dB per octave forming the first high-pass filter stage followed by a high-pass filter having a slope of 6 dB per octave forming in combination with the 18 dB per octave filter the second high-pass filter stage.

Each auxiliary comparator means may include a comparator the input of which is connected to the input of the corresponding first high-pass filter stage via a first resistor and to the output of this high-pass stage via a second resistor, the ratio of the value of the first resistor to that of the second resistor defining said predetermined coefficient, which is advantageously between approximately 1.33 and approximately 2.

In one embodiment of the invention the control means include a first transistor connecting the output of the first processor means to the input of a voltage follower the output of which is connected to the control input of the variable gain amplifier and the base of which transistor is connected to the output of each auxiliary comparator means via OR logic gate means; a second transistor is also provided, connected between ground and the input of the follower, and the base of which is connected to the output of the main comparator means including a comparator the input of which is connected to the outputs of the two processor means by two resistors of unequal value having a chosen ratio.

The equalizer is advantageously removable, so that it can be incorporated into the device of the invention or not. The presence of the equalizer in the device renders the second auxiliary comparator means inoperative.

It is particularly advantageous if the first filter means include an auxiliary high-pass filter stage between the pick-up means and the corresponding first high-pass filter stage and having a cut-off frequency less than that of the first high-pass filter stage, preferably equal to 100 Hz, and the highest possible slope, for example 18 dB/octave.

In accordance with another general feature of the invention, when the variable gain amplifier has a plurality of input and output channels, the acquisition means include discriminator means connected to the output channels of the variable gain amplifier and adapted to deliver at all times at an output the signal from the output channel at the highest level.

In an embodiment of the invention in which the amplifier has a first pair of channels respectively connected to a first pair of loudspeakers and a second pair of channels respectively connected to a second pair of loudspeakers, the discriminator means include:

- four signal inputs respectively connected to the four channels,
- four switch units respectively connecting the four inputs to the output of the discriminator means,
- first comparator means for comparing the sum of the levels of the channels of the first pair with the sum of the levels of the channels of the second pair,
- first control means adapted to open or close the two switches connected to the same pair as a function of the result of the first comparison,
- second comparator means for comparing the sum of the levels of one channel of the first pair and the like channel of the second pair with the sum of the levels of the other channel of the first pair and the like channel of the second pair, and
- second control means adapted to open or close one of the two switches not opened by the action of the first control means; the only switch finally closed is that connecting the channel on which the signal level is highest to the output of the discriminator means.

Each switch unit advantageously includes two transistors the commoned collectors of which are connected to the corresponding signal input and to the output of the discriminator means, the emitters of which are connected to ground and the respective bases of which are connected to the respective outputs of the two comparators of the two comparator means.

Other advantages and features of the invention will emerge from a reading of the following detailed description of the appended drawings in which.

Figure 1:
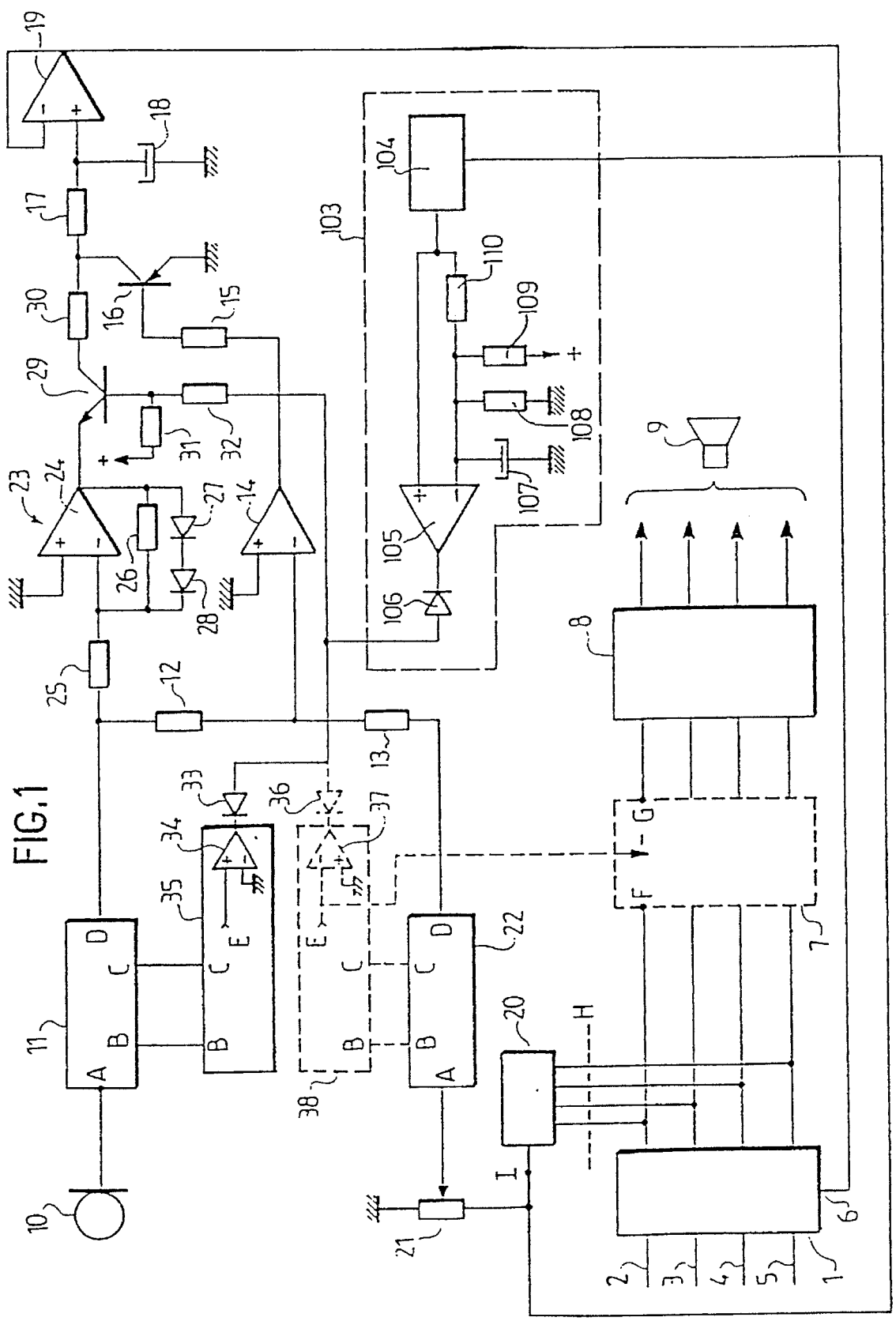
FIG. 1 is a general block schematic of one embodiment of a device in accordance with the invention.

FIG. 1 shows a variable gain amplifier 1 such as the PHILIPS TDA 1074. The amplifier 1 has four input and output channels 2, 3, 4 and 5 and a gain control input 6 (pins 9 and 10 of the TDA 1074 device connected together in this application). It is part of an audio frequency electroacoustic system installed in an automobile vehicle, for example, and is connected by the four channels, an optional equalizer 7 and a power amplifier 8 to four loudspeakers 9 conventionally disposed with one pair at the front and the other pair at the rear of the vehicle.

The gain control system of the amplifier 1 has two main parts.

The first part includes pick-up means such as a background noise microphone 10 adapted to pick up a complex signal comprising a mixture of background noise and sound from the loudspeakers. The microphone 10 is connected to the input A of first processing means 11 for treating the complex signal, an output D of which is connected via a resistor 12 to the inverting input of an operational amplifier 14 configured as a comparator and the non-inverting input of which is connected to ground. The second part of this control system includes means for acquisition of a wanted or pure signal sampled at the output of the variable gain amplifier 1. In this example the second part of the control system includes discriminator means 20 described in more detail below. Level adjusting means 21 such as a potentiometer are also provided.

The output of the potentiometer is connected to the input A of second processing means 22 for treating the acquired wanted signal, an output D of which is connected to the inverting input of the operational amplifier 14 via a resistor 13 of lower value than the resistor 12. The value in dB of the ratio R of the value of the resistor 12 to the value of the resistor 13 represents the safety margin of the device.

The output of the comparator 14 is connected to the base of a PNP switching transistor 16 via a base resistor 15. The emitter of the transistor 16 is connected to ground and its collector is connected via a resistor 17 to the input of a voltage follower 19 the output of which controls the gain of the amplifier 1.

A logarithmic amplifier 23 supplies a voltage controlling the variable gain amplifier. Its input is connected to the output D of the first processor means and its output is connected to the collector of the transistor 16 and thus to the input of the voltage follower 19 via the emitter-collector junction of an NPN transistor 29, the function of which is explained below, and another resistor 30. The logarithmic amplifier 23 conventionally comprises an operational amplifier 24 the non-inverting input of which is connected to ground and the inverting input of which is connected to a resistor 25. The amplifier 24 has a feedback resistor 26 in parallel with two series-connected diodes 27 and 28, the cathode of the diode 28 being connected to the inverting input of the amplifier 24.

The theory of operation of this device is as follows: if the level of the treated signal available at the output D of the first processor means 11 is greater (allowing for the safety margin) than the level of the treated signal available at the output D of the second processor means 22, i.e. if the level of the treated complex signal is greater (allowing for the safety margin) than the level of the treated pure signal, the output of the comparator 14 is positive which turns off the transistor 16 and, provided that the transistor 29 is turned on, applies to the input of the voltage follower 19 the treated signal present at the output D of the first processor means, integrated with a time constant (for example four seconds) defined by the product of the value of a capacitor 18 connected between the positive input of the voltage follower and ground by the sum of the resistors 30 and 17. This authorizes an increase in the gain of the variable gain amplifier 1.

On the other hand, if the level of the treated pure signal available at the output D of the second processor means is greater (allowing for the safety margin) than the level of the like signal available at the output of the first processor means 11, the output of the comparator is negative which turns on the transistor 16 enabling the capacitor 18 to discharge via the resistor 17, which reduces the gain of the amplifier 1.

The base of the transistor 29 is connected via a resistor bridge 31/32 connected to the positive power supply of the device to the anodes of two diodes 33 and 36 the respective cathodes of which are connected to the outputs of two comparators 34 and 37 which are respectively part of first and second auxiliary comparator means 35 and 38 described in more detail below with particular reference to FIG. 2.

Figure 2:
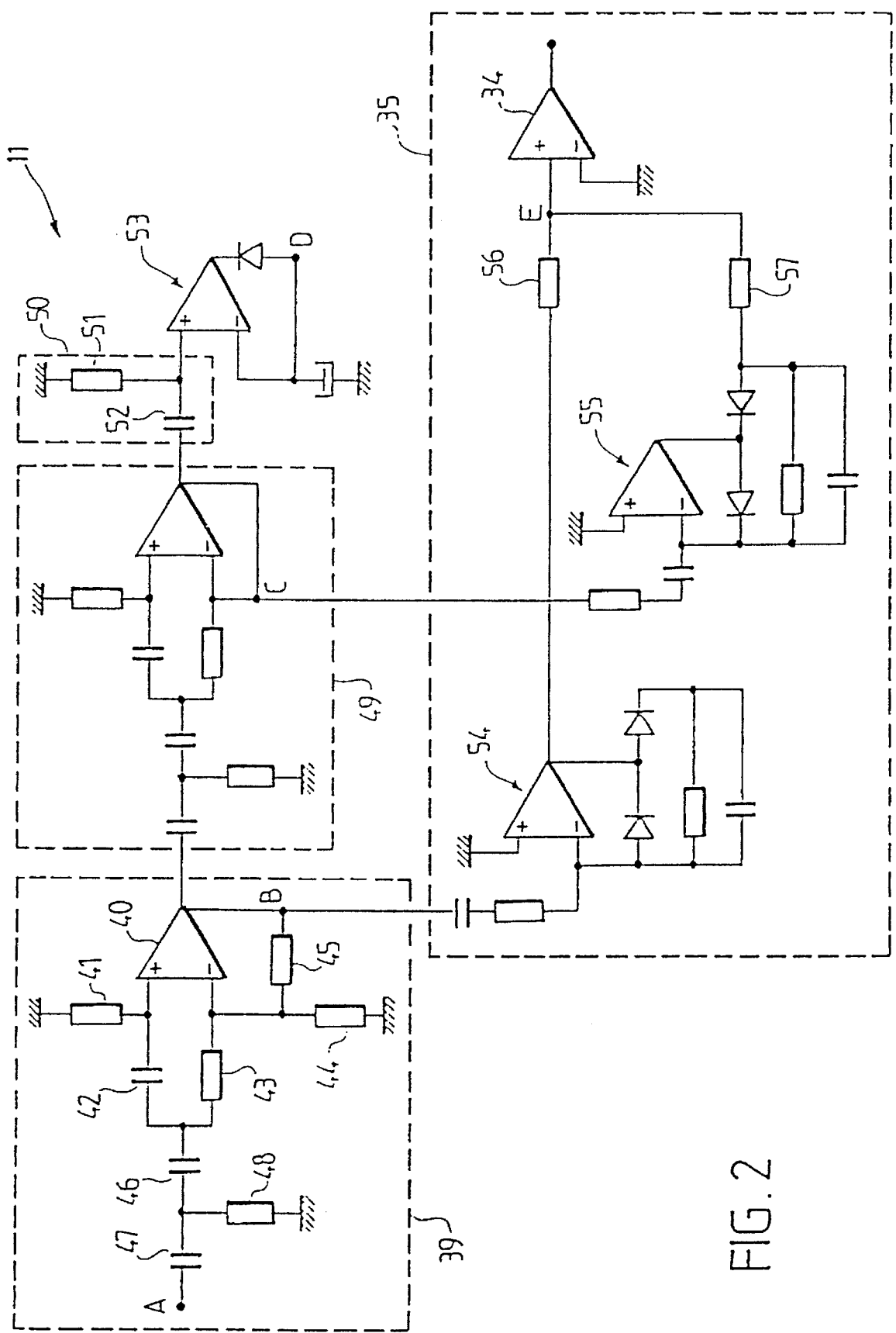
FIG. 2 shows in more detail part of the device from FIG. 1.

Referring to FIG. 2, the first auxiliary comparator means 35 include two rectifiers 54 and 55 with no threshold respectively connected to two outputs B and C of the first processor means 11. To be more precise, the rectifier 54 connected to the output B and supplying a positively rectified signal includes in the conventional way an operational amplifier the positive input of which is connected to ground and the negative input of which is connected to a capacitor in series with a resistor and to a first diode (feedback diode). Another diode is connected in series with the first, the two diodes being connected in parallel with a resistor and a filter capacitor. The rectification polarity is shown by which way round the diodes are connected (anode connected to the inverting input of the amplifier).

The rectifier 55, supplying a negative rectified voltage, has a similar structure to the rectifier 54, with the exception of which way round the two diodes are connected.

The outputs of the two rectifiers 54 and 55 are connected to the positive input of the comparator 34 via respective resistors 56 and 57. The person skilled in the art will note that the first auxiliary comparator means, in particular the comparator 34, is adapted to compare the level of the signal at output B to the level of the signal at output C of the first processor means 11 multiplied by a predetermined coefficient. In other words, the comparator 34 compares the level of the signal at B to the product of the level of the signal at C by a predetermined coefficient defined by the ratio of the resistance of a resistor 56 to that of a resistor 57. This ratio is advantageously between about 1.33 and about 2, for reasons explained in more detail below.

Point B is the output of an auxiliary high-pass filter stage 39 the input A of which is connected to the microphone 10. This auxiliary stage has an input capacitor 47 in series with a resistor 48 connected to ground. The non-inverting input of an operational amplifier 40 is connected to ground via a resistor 41 and to the common point of the resistor 48 and the capacitor 47 by two series-connected capacitors 42 and 46. The inverting input of the amplifier 40 is connected to the common point of the two capacitors 42 and 46 via a resistor 43 and to ground via a resistor 44. The amplifier has a feedback resistor 45. The system constitutes a high-pass filter having a cut-off frequency from 50 Hz to 100 Hz and a slope of 18 dB/octave. The resistor bridge 44/45 confers a gain of 50 on the auxiliary stage 39, amplifying to the appropriate level the signal received from the microphone 10.

The output B of the auxiliary high-pass filter stage 39 is also the input of a first high-pass filter stage 49 with no gain, a cut-off frequency of 180 Hz and a slope of 18 dB/octave. The first high-pass filter stage 49 is identical to the operational amplifier circuit of the auxiliary stage 39.

The output C of the first high-pass filter stage 49 is connected to the input of a second high-pass filter 50 having a cut-off frequency substantially equal to 1 000 Hz and a slope of 6 dB/octave. This filter conventionally comprises a 4.7 nF capacitor 52 connected in series with a 47 kΩ resistor 51 connected to ground.

Figure 3:
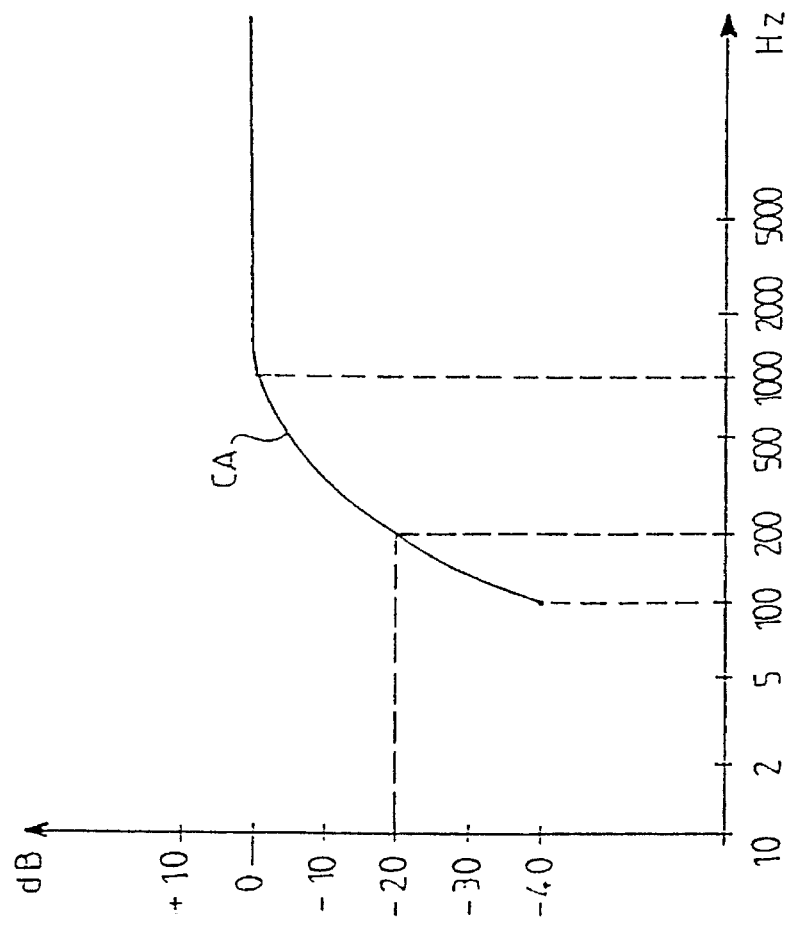
FIG. 3 shows the attenuation curve of a high-pass filter used in the device from FIG. 1.

The combination of the filter stage 49 and the filter stage 50 forms a high-pass filter having a cut-off frequency in the order of 1 000 Hz and an attenuation curve CA (FIG. 3) with an attenuation in the order of −40 dB at 100 Hz and in the order of −20 dB at 200 Hz.

The signal available at the output of the filter 50 is then peak detected by a positive peak detector 53 the output D of which constitutes that of the first processor means 11.

The second processor means 22 are similar to the first processor means 11, with one difference, namely that the auxiliary filter stage having a cut-off frequency of 100 Hz is eliminated as it is not required. The points A and B are therefore one and the same. The output of the second filter means drives a negative peak detector.

The second auxiliary comparator means 38 are similar to the first auxiliary comparator means 35, except that the point E is connected to the negative input of the comparator 37, the positive input of which is connected to ground (FIG. 1).

In one embodiment of the device of the invention the equalizer 7 is connected on the output side of the variable gain amplifier 1. To this end, the equalizer 7 is advantageously a removable module which the user can plug into their automobile's radio. The effect of inserting the equalizer 7 is to connect the negative supply to the inverting input of the comparator 37, which forces its output to a positive value, and this in combination with the diode 36 disables the second auxiliary comparator means 38.

Figure 4:
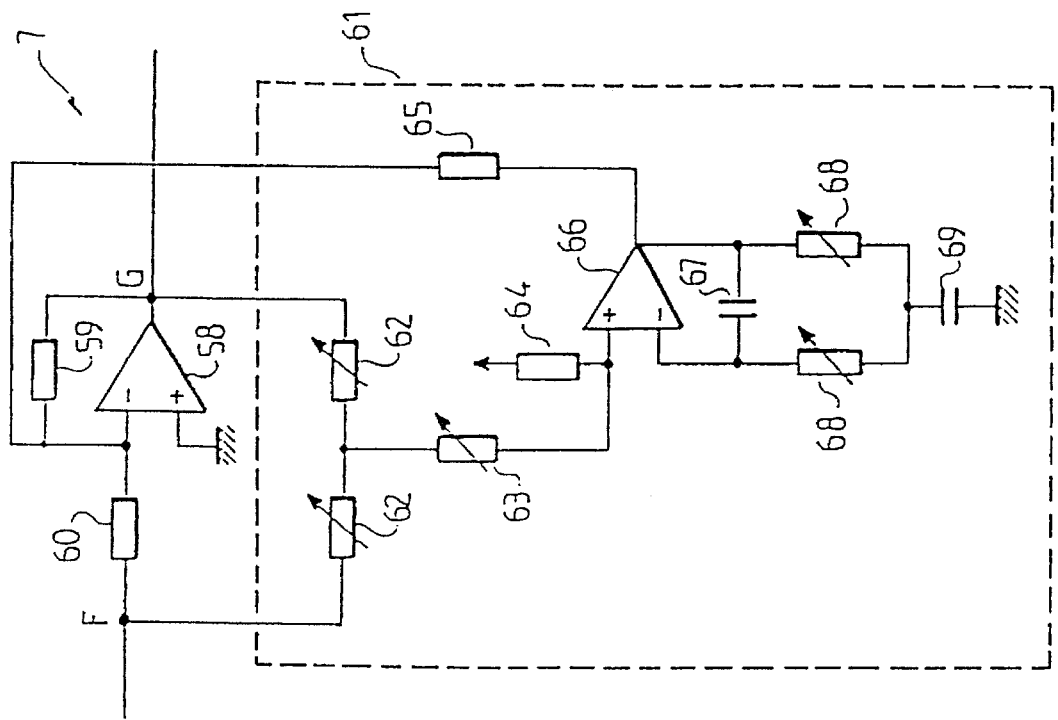
FIG. 4 shows in more detail part of an equalizer of the device from FIG. 1.

The equalizer is advantageously of the fixed correction parametric type and is shown in FIG. 4. It is adapted to prevent the comparator 14 from increasing the gain of the amplifier in the absence of any noise and for any pure signal frequency less than or equal to the cut-off frequency of the first high-pass filter stage 49, i.e. any frequency less than or equal to 180 Hz in this case.

The equalizer includes between the input F and the output G of each channel an operational amplifier 58 configured as an inverter with unity gain set by two resistors 59 and 60 of equal value (for example 22 kΩ). One or more equalizer circuits 61 are connected to the inverter stage and include an operational amplifier 66 configured as a band-pass filter the frequency of which is adjusted by resistors 68 of equal value, between 470 Ω and 470 kΩ, to suit the installation. The amplifier 66 is powered via a divider bridge comprising the resistors 63 and 64. Two coupled variable resistors 62 connected in series to the input F and the output G constitute a potentiometer system for varying the gain of the band-pass filter as a function of the ratio of the two resistors 62. The bandwidth is adjusted by the ratio of the resistance of the resistor 63 to that of the resistor 64.

In this example the sum of the resistances of the two resistors 62 is equal to 47 kΩ and the resistance of the resistor 63 is less than 2 MΩ, also adjusted to suit the installation.

Figure 5:
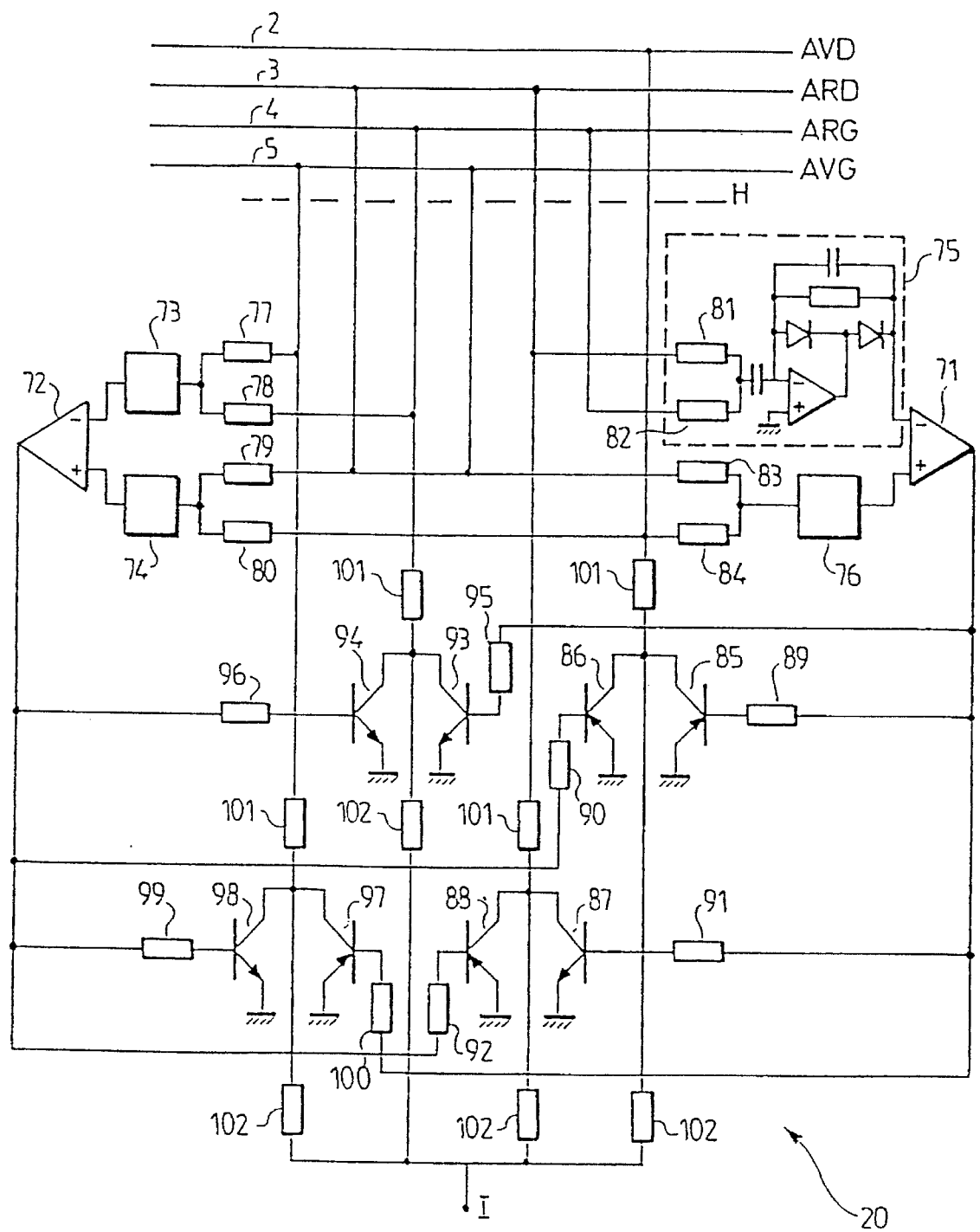
FIG. 5 is a more detailed block schematic of discriminator means of the device from FIG. 1.

The discriminator means 20 will now be described in more detail with particular reference to FIG. 5.

The input H of the discriminator means 20 is connected to the four channels 2, 3, 4, 5 which are discussed here in pairs, namely, for example, a first pair of channels 3 and 4 respectively connected to the two rear loudspeakers and a second pair of channels 2 and 5 respectively connected to the two front loudspeakers.

The four channels are connected to the output I of the discriminator means by four switching units. Two of these units respectively comprise two identical PNP or NPN transistors 85, 86 and 93, 94. The other two units respectively comprise two complementary PNP and NPN transistors 87, 88 and 97, 98. The emitters of each of the two transistors forming a switching unit are connected to ground and the two collectors are connected to one channel via a resistor 101 and to the output I via a resistor 102.

A switching unit is "open" (i.e. it does not connect the corresponding channel to the output) when either of the two transistors constituting it is turned on. A switching unit is "closed" (i.e. connects the corresponding channel to the output) when both transistors constituting it are turned off.

The inverting input of an operational amplifier 71 configured as a comparator is connected to the first pair of channels 3 and 4 via a summing rectifier 75 comprising two resistors 81 and 82 followed by a rectifier circuit similar to that of the rectifier 54.

The non-inverting input of the operational amplifier 71 is connected to the second pair of channels 2 and 5 via another summing rectifier 76, 83 and 84, of similar design to the summing rectifier 75.

A second operational amplifier 72 similar to the amplifier 71 is also configured as a comparator. Its negative input is also connected via a summing rectifier 73, 77, 78 to a channel of the first pair and to a channel of the second pair; in other words, in this example, to the front lefthand channel 5 and to the rear lefthand channel 4. The positive input of the comparator 72 is connected via another summing rectifier 74, 79, 80 respectively to two other channels of the two pairs, in this example to the front and rear righthand channels.

The output of the comparator 71 is connected via four base resistors 95, 89, 91 and 100 to the respective bases of the four transistors 85, 93, 87 and 97 of the four switching units. The output of the comparator 72 is connected by four base resistors 96, 99, 90 and 92 to the respective bases of four associated transistors 94, 98, 86 and 88 of these four switching units.

The operation of the device of the invention will now be described in detail.

The attenuation curve CA of the second high-pass filter stage is similar to that of the spectral envelope of human speech in the lower register (frequencies below 1000 Hz), as it has been found by observation that this corresponds to the statistically most probable and most useful signal envelope.

The use of a curve of this kind allows for automobile noises that are actually a problem in that they mask human speech, for example, or a musical signal having a comparable spectral envelope, and also strongly attenuates low frequency noises although they are not really a problem from the point of view of masking of the signal.

Although the attenuation curve shown here contributes to obtaining very high levels of performance from the device, it has been found that it is possible to use a high-pass filter having a cut-off frequency between about 500 Hz and about 2 000 Hz and an attenuation at least in the order of 30 dB at around 100 Hz.

The noise generated by an automobile is usually rich in low frequencies and the adoption of an attenuation curve in accordance with the invention contributes to a reduction in the noise spectral density and therefore to a reduced differential between the level of the signal affected by noise at the output D of the first processor means 11 and the level of the signal free of noise at the output D of the second processor means 22. One way to prevent unwanted operation of the device leading to runaway is to adopt a relatively wide safety margin. However, this is unsatisfactory in that it would lead to the comparator 14 authorizing an increase in the gain of the amplifier via the transistor 16 only in the presence of a noise level such that in any event the listener would be unable to hear any of the signal from the loudspeaker well before the system operated.

Also, it has been found that it is necessary to adopt a safety margin of between about 1.5 dB and about 4 dB, preferably in the order of 2 dB.

The device is calibrated in the following manner. Pink noise is fed into the variable gain amplifier and, using the potentiometer 21, the level is adjusted to obtain voltages at the respective outputs D of the first processor means 11 and the second processor means 22 which are equal in absolute value. Given this adjustment and the safety margin chosen, the comparator 14 will initiate an increase in gain only if the voltage at point D of the first processor means is 2 dB (the safety margin) above that at point D of the second processor means 22.

A simple calculation shows that in this event the sound pressure level of the background noise is 2 dB below that of the signal from the loudspeaker, representing an improvement (in terms of overcompensation phenomena) of system performance equal to 13 dB relative to the prior art device with no equalizer or 7 dB relative to the prior art device with an equalizer.

The person skilled in the art will understand that with a safety margin of this size there is a high risk of the device running away in normal operation with the signal subject to noise. Also,- the first and second auxiliary comparator means 35 and 38 contribute in the first embodiment of the device to avoiding such runaway, by the same token as the first auxiliary comparator means 35 in combination with the equalizer 7 in the second embodiment and the third auxiliary comparator means 35 on their own in the third embodiment concerning an autostable electroacoustic system.

The first auxiliary comparator means 35 compare the level of the signal subject to noise sampled on the input side of the first high-pass filter stage 49 with the level of the same signal sampled at the output of the filter stage 49, allowing for the ratio of the resistors 56 and 57. When the level of the signal sampled at point B is less than the product of the level of the corresponding signal sampled at point C by the ratio of the resistors 56 and 57, the comparator 34 supplies a negative voltage which turns off the transistor 29 and samples the voltage via the voltage follower 19 if the transistor 16 is turned off. Because of the capacitor 18, the follower 19 retains its value and prevents an increase in the gain of the amplifier 1 and consequently runaway of the device. It has been found that it is necessary to turn off the transistor 29 when the level of the signal at B is not sufficient greater than the level of the signal at C because in this case the signal treated by the first processor means 11 may not be representative of automobile noise.

Otherwise, i.e. if the level of the signal sampled at point B is greater than the product of the level of the signal sampled at point C by the ratio of the resistors 56/57, it is highly probable that the signal output by the first processor means is actually affected by automobile noise. The transistor 29 is then turned on by the combination of the positive output of the comparator 34 and the diode 33.

The ratio of the resistors 56/57 chosen (between about 1.33 and about 2) is an experimental compromise between self-disabling of the system if the background noise contains high frequencies and difficulty in disabling leading to overcompensation which is prejudicial to correct operation of the device.

What is more, the time constant defining the rate of response of the transistor 29 (defined by the values of the resistor and the capacitor of the rectifiers 54 and 55, and assumed here to be in the order of $1/10$ s) is very short in comparison to the time constant defined by the resistors 30, 17 and the capacitor 18 (which is in the order of 4 s). Also, although the transistors 16 and 29 respond at the same speed, only a fraction of the voltage delivered by the logarithmic amplifier 23 is applied to the voltage follower 19 for the time for which the transistor 29 is turned off. In other words, the decision to prevent an increase in the gain of the amplifier via the transistor 29 is taken before operation of the comparator 14 has commanded this increase.

With reference to the cut-off frequency chosen for the first high-pass filter stage 49, it has been found that this frequency must be lower than the fundamental frequency of a male voice and higher than the highest fundamental frequency of automobile noise. A satisfactory solution is a frequency around 180 Hz; the possible range is between about 150 Hz and about 200 Hz.

Although it is possible to dispense with the auxiliary high-pass filter stage 39, which has a cut-off frequency in the order of 50 Hz (but which can be up to around 100 Hz), it is considered preferable to sample the signal at point B, i.e. on the input side of the filter stage 49, but on the output side of the auxiliary stage 39, in order to filter very low noise frequencies which can occur in some types of vehicle. In this case, in the absence of any such auxiliary filter stage 39, the ratio of the resistors 56/57 would have to be increased to an excessively high value which would prejudice correct operation of the device, as explained already.

The choice of the cut-off frequency of the stage 39 relative to that of the stage 49 also conditions the choice of the predetermined coefficient defined by the ratio of the resistors 56/57. For a frequency ratio in the order of ½ a coefficient of 1.33 is preferably chosen whereas for a ratio in the order of ¼ a coefficient in the order of 2 is preferred.

The second auxiliary comparator means 38 in the first embodiment of the device prevent runaway of the system, i.e. an irreversible increase in the gain of the amplifier 1, on a wanted signal the frequency of which is less than or equal to the cut-off frequency of the first high-pass filter stage 49, i.e. a frequency below or equal to 180 Hz.

With a level of the signal sampled at point B of the second processor means 22 greater than the product of the level of the corresponding signal sampled at point C by the predetermined coefficient equal to the ratio of the resistors 56/57, the comparator 37 in combination with the diode 36 turns off the transistor 29 which causes the voltage follower to retain its previous control value.

It is possible to dispense with the second auxiliary comparator means 38 by inserting the equalizer 7 into the electroacoustic system which, in the embodiment described, renders the second auxiliary comparator means 38 inoperative. The equalizer 7 is set to a value such that, for no pure signal frequency below the cut-off frequency of the first high-pass filter stage, i.e. around 180 Hz, is the level of the voltage from the microphone reaching the main comparator 14 higher than the voltage from the second processor means reaching the same comparator, allowing naturally for the safety margin adopted. In other words, the set value is chosen to avoid, in the absence of any noise, the comparator increasing the gain of the amplifier for any pure signal frequency less than 180 Hz. The person skilled in the art will understand that with this adjustment runaway of the system is prevented for any wanted signal at a frequency below 180 Hz.

The equalizer is preferably on the output side of the amplifier 1, because it contributes both to the stability of the device and to the quality of reproduction. Nevertheless, it could be disposed elsewhere, for example at the input of the second processor means 22.

In a different embodiment of the invention it is possible to dispense with any such equalizer. This is possible if the electroacoustic system is autostable below the cut-off frequency (180 Hz) of the first high-pass filter stage. In the context of the present invention an electroacoustic system is deemed to be autostable below this cut-off frequency if the main comparator 14 does not increase the gain of the amplifier when, after the calibration phase using pink noise, a pure signal is injected in the form of a sinusoidal signal of variable frequency and its frequency is increased (with no background noise) from a starting frequency (for example 20 Hz) to the cut-off frequency (180 Hz).

In this case, the first auxiliary comparator means 35 are sufficient on their own to ensure that the system is stable and in conjunction with the filters of the first processor means 11 solve the problem as stated.

Note also that the combination of the filter stages 39 and 49 also discriminates between noise produced by the vehicle and conversation of the passengers, which prevents such conversation being deemed to be noise and an increase in the gain in order to compensate for it.

Also, the use of peak detectors reduces the disparity between the response of the device to sustained pure notes producing a very low signal/noise ratio and passages containing many transients in which the signal/noise ratio is very high.

To prevent unwanted increases in gain in "quasi-gaps" appropriate means 103 can be incorporated into each of the embodiments described above. Referring to FIG. 1, the means 103 essentially comprise a rectifier circuit 104 similar to the rectifier 54 and the function of which is to rectify the signal output by the discriminator means 20. It feeds directly the positive input of an operational amplifier 105 configured as a comparator. It also feeds its negative input via a voltage divider bridge comprising resistors 108 and 110 of substantially the same value.

A resistor 109 connected between the negative input 2 of the comparator 105 and the positive supply and having a value which is very much higher than that of the resistors 108 and 110 forms with the resistor 108 a voltage divider with a ratio of 40 dB to 50 dB.

A capacitor 107 is connected between the negative input of the comparator 105 and ground and the output of the comparator 105 is connected to the base resistor 32 of the transistor 29 via a diode 106.

The means 103 operate in the following manner: when no sound signal is being reproduced, for example at the beginning of a disk, the voltage from the rectifier 104 is a null voltage and the resistor 109 connected to the positive supply means that the inverting input of the amplifier 105 is slightly positive, so that its output is negative which, via the diode 106, turns off the transistor 29 and prevents any increase in the gain in the absence of a sound signal. As soon as the sound signal starts, the output of the comparator 101 goes positive, which turns on the transistor 29. Under steady-state conditions, because of the resistor bridge 106, 104, the voltage at the positive input of the comparator 105 is greater than that at the negative input, the consequence of which is to maintain the output of the comparator 105 positive and the transistor 29 turned on.

If the signal level falls rapidly by more than 6 dB, the positive input of the comparator 105 tracks the reduction instantaneously, but not its negative input, where the voltage drop is delayed by the capacitor 107. The output of the comparator 105 goes negative again, which turns off the transistor 29. On the other hand, if the wanted signal level falls gradually, the capacitor 107 charges fairly quickly so that the voltage at the negative input of the comparator 105 does not become greater than that at the positive input. As a result, the transistor 29 remains turned on and the gain continues to increase as the signal falls without being suddenly interrupted, which is the main object of the device as a whole.

Thus the means 103 are able to prevent any increase in the gain in the absence of a sound signal or in the presence of a reduction in the wanted signal greater than a predetermined reduction (in the present example a reduction of more than 6 dB at a rate faster than the capacitor 107 discharges). The values of the various components of the means 103 are chosen experimentally. Good results have been obtained with a capacitor 107 of 10 μF, a resistor 109 in the order of 10 MΩ and resistors 108 and 110 in the order of 22 kΩ.

To avoid rendering the system unstable when adjusting the left/right and/or front/rear balance controls of the system, the first comparator 71 of the discriminator means 20 compares the sum of the levels of channels 3 and 4 of the first pair with the sum of the levels of channels 2 and 5 of the second pair and commands opening of two switches connected to the pair giving the lower sum and the second comparator 72 compares the sum of the levels of one channel of the first pair and the like channel of the second pair with the sum of the levels of the other channel of the first pair and the like channel of the second pair and commands opening of that of the two switches not opened by the first control means and connected to the channel whose level contributes to the lower sum.

Accordingly, the only switch that is finally closed connects at all times the output I of the discriminator means 20 to the channel carrying the highest level signal.

If the front/rear balance control is operated to turn up the front two channels the output of the comparator 71 is positive, which turns on the transistors 93 and 87, so disabling the two rear channels 3 and 4 (switches open).

If the left/right balance control is operated to turn up the lefthand channels 4 and 5 the output of the comparator 72 is negative, when turns on the transistors 86 and 88, so disabling the two righthand channels. The comparator 72 has therefore opened the switch 86, 85 which was not opened by the comparator 71. Accordingly, only the front lefthand channel 5 is connected to the output I of the discriminator means, the transistors 97 and 98 remaining turned off by the comparators 71 and 72.

In this manner, when moving away from centered left/right and front/rear balance settings, the signal from the amplifier 1 remains constant and that from the microphone 10 can only decrease in level. This may cause undercompensation, which is entirely preferable to runaway.

Of course, other means can be envisaged for selecting the most powerful channel, for example an optical read-off from mechanical potentiometers, or reading of memories in the case of electronic potentiometers.

Likewise, although all the means of the present invention have been described here as analog means, at least some can be implemented digitally, especially the filters, using a digital signal processor, for example.

I claim:

1. Automatic gain control method for a variable gain amplifier in an electroacoustic system, comprising:
 a) effecting a first treatment, including a first filtering sub-treatment, on a complex signal containing a mixture of background noise and sound signals from loudspeakers to obtain a first treated signal,
 b) effecting a second treatment, including a second filtering sub-treatment, on a wanted signal sampled at the output of the amplifier to obtain a second treated signal,
 each filtering sub-treatment including first high-pass filtering with a low cut-off frequency and second high-pass filtering with a medium cut-off frequency and an attenuation of at least approximately 30 dB at approximately 100 Hz, and
 c) controlling the gain of the amplifier as a function of the comparative levels of the two treated signals, such that increase in the gain of the amplifier is prevented if the level of the signal sampled on the input side of the first high-pass filtering of the first filtering sub-treatment is less than the product of the level of the corresponding signal sampled on the output side of the first high-pass filtering by a predetermined coefficient greater than 1 or
 if the level of the signal sampled on the input side of the first high-pass filtering of the second filtering sub-treatment is greater than the product of the level of the corresponding signal sampled on the output side of the first high-pass filtering by a predetermined coefficient greater than 1.

2. Automatic gain control method for a variable gain amplifier in an electroacoustic system, comprising:
 a) effecting a first treatment, including a first filtering sub-treatment, on a complex signal containing a mixture of background noise and sound signals from loudspeakers to obtain a first treated signal,
 b) effecting a second treatment, including a second filtering sub-treatment, on a wanted signal sampled at the output of the amplifier to obtain a second treated signal,
 each filtering sub-treatment including first high-pass filtering with a low cut-off frequency and second high-pass filtering with a medium cut-off frequency and an attenuation of at least approximately 30 dB at approximately 100 Hz, and
 c) controlling the gain of the amplifier as a function of the comparative levels of the two treated signals, such that
 a provided equalizer is adjusted to prevent increase in the gain of the amplifier by any wanted signal, the frequency of which is less than or equal to the cut-off frequency of the first high-pass filtering in the absence of noise, and
 an increase in the gain of the amplifier is prevented when the level of the signal sampled on the input side of the first high-pass filtering of the first filtering sub-treatment is less than the product of the level of the corresponding signal sampled on the output side of the first high-pass filtering by a predetermined coefficient greater than 1.

3. Automatic gain control method for a variable gain amplifier in an electroacoustic system, comprising:
 a) effecting a first treatment, including a first filtering sub-treatment, on a complex signal containing a mixture of background noise and sound signals from loudspeakers to obtain a first treated signal,
 b) effecting a second treatment, including a second filtering sub-treatment, on a wanted signal sampled at the output of the amplifier to obtain a second treated signal,
 each filtering sub-treatment including first high-pass filtering with a low cut-off frequency and second high-pass filtering with a medium cut-off frequency and an attenuation of at least approximately 30 dB at approximately 100 Hz, and
 c) controlling the gain of the amplifier as a function of the comparative levels of the two treated signals, such that
 the electroacoustic system is autostable below the cut-off frequency of the first high-pass filtering, and
 increase in the gain of the amplifier is prevented if the level of the signal sampled on the input side of the first high-pass filtering of the first filtering sub-treatment is less than the product of the level of the corresponding signal sampled on the output side of the first high-pass filtering by a predetermined coefficient greater than 1.

4. Method according to claim 1, further including performing a calibration phase in which a pink noise signal is fed to the input of the amplifier and a level adjustment is effected preventing increase in the gain of the amplifier by the first treated signal, to thereby allow for a safety margin between about 1.5 dB and about 6 dB.

5. Method according to claim 1 wherein the second high-pass filtering has an attenuation curve (CA) with an attenuation in the order of −40 dB at 100 Hz and in the order of −20 dB at 200 Hz.

6. Method according to claim 1, wherein the complex signal is filtered on the input side of the first high-pass filtering of the first filtering sub-treatment by an auxiliary high-pass filter having a cut-off frequency lower than the low cut-off frequency of the first high-pass filtering, and the level of the signal sampled on the output side of the auxiliary filtering is compared to the level of the corresponding signal sampled on the output side of the first high-pass filtering, to decide whether to prevent increase in the gain of the amplifier.

7. Method according to claim 1 wherein, for each sampled wanted signal and complex signal present at the input of the corresponding processing means, the decision to prevent increase in the gain is taken before any increase in the gain is effected.

8. Method according to claim 1 wherein the amplifier includes a plurality of input and output channels, and the wanted signal is always sampled on the channel having the highest signal level.

9. Automatic gain control device for a variable gain amplifier in an electroacoustic system, comprising:

means for picking up a complex signal containing a mixture of background noise and sound signals from loudspeakers, means for acquiring a wanted signal at the amplifier output, first processing means for treating the complex signal, the first processing means incorporating first filter means and being adapted to deliver a first treated signal, second processing means for treating the acquired wanted signal, the second processing means incorporating second filter means and being adapted to deliver a second treated signal, the filter means each including a first high-pass filter stage with a low cut-off frequency and a second high-pass filter stage with a medium cut-off frequency and an attenuation of at least approximately 30 dB at approximately 100 Hz, main comparator means for comparing the first and second treated signals while allowing for a predetermined safety margin, and adapted to deliver a main comparison signal, control means adapted to command an increase or a decrease in the gain of the amplifier as a function of the value of the main comparison signal, first auxiliary comparator means provided and adapted to compare the respective levels of the signals sampled on the input side and on the output side of the first high-pass filter stage of the first filter means and to deliver a first auxiliary comparison signal having a first value if the level of the signal sampled on the input side of the first high-pass filter stage of the first filter means is less than the product of the level of the signal sampled on the output side of the first high-pass filter stage of the first filter means by a predetermined coefficient greater than 1, and a second value otherwise, and second auxiliary comparator means provided and adapted to compare the respective levels of the signals sampled on the input side and on the output side of the first high-pass filter stage of the second filter means and to deliver a second comparison signal having a first value if the level of the signal sampled on the input side of the first high-pass filter stage of the second filter means is greater than the product of the level of the signal sampled on the output side of the first high-pass filter stage of the second filter means by a predetermined coefficient greater than 1, and a second value otherwise, and the control means being adapted to prevent increase in the gain of the amplifier if the first and second auxiliary comparator means deliver their first values.

10. Automatic gain control device for a variable gain amplifier in an electroacoustic system, comprising:

means for picking up a complex signal containing a mixture of background noise and sound signals from loudspeakers, means for acquiring a wanted signal at the amplifier output, first processing means for treating the complex signal, the first processing means incorporating first filter means and being adapted to deliver a first treated signal, second processing means for treating the acquired wanted signal, the second processing means incorporating second filter means and being adapted to deliver a second treated signal, the filter means each including a first high-pass filter stage with a low cut-off frequency and a second high-pass filter stage with a medium cut-off frequency and an attenuation of at least approximately 30 dB at approximately 100 Hz, main comparator means for comparing the first and second treated signals while allowing for a predetermined safety margin, and adapted to deliver a main comparison signal, equalizer means set to prevent increase in the gain of the amplifier for any wanted signal of frequency less than or equal to the cut-off frequency of the first high-pass filter stage, in the absence of noise, first auxiliary comparator means for comprising the respective levels of the signals sampled on the input side and on the output side of the first high-pass filter stage of the first filter means and to deliver a first auxiliary comparison signal having a first value if the level of the signal sampled on the input side of the first high-pass filter stage of the first filter means is less than the product of the level of the signal sampled on the output side of the first high-pass filter stage by a predetermined coefficient greater than 1, and a second value otherwise, and control means for commanding an increase or a decrease in the gain of the amplifier as a function of the value of the main comparison signal, and preventing increase in the gain of the amplifier if the first auxiliary comparator means deliver their first value.

11. Device according to claim 10 wherein the equalizer means is a fixed correction parametric equalizer removably disposed on the output side of the amplifier.

12. Device according to claim 9 further including a fixed correction parametric equalizer removably disposed on the output side of the variable gain amplifier, the equalizer being set to prevent increase in the gain of the amplifier for any wanted signal of frequency less than or equal to the cut-off frequency of the first high-pass filter stage, in the absence of noise, such that the presence of the equalizer in the device renders the second auxiliary comparator means inoperative.

13. Automatic gain control device for an amplifier in an electroacoustic system, including:
  means for picking up a complex signal containing a mixture of background noise and sound signals from loudspeakers,
  means for acquiring a wanted signal at the amplifier output,
  first processing means for treating the complex signal, the first processing means incorporating first filter means and being adapted to deliver a first treated signal,
  second processing means for treating the acquired wanted signal, the second processing means incorporating second filter means and adapted to deliver a second treated signal,
  the filter means each including a first high-pass filter stage with a low cut-off frequency and a second high-pass filter stage with a medium cut-off frequency and an attenuation of at least approximately 30 dB at approximately 100 Hz,
  main comparator means for comparing the first and second treated signals while allowing for a predetermined safety margin, and adapted to deliver a main comparison signal,
  first auxiliary comparator means for comparing the respective levels of the signals sampled on the input side and on the output side of the first high-pass filter stage of the first filter means and to deliver a first auxiliary comparison signal having a first value if the level of the signal sampled on the input side of the first high-pass filter stage of the first filter means is less than the product of the level of the signal sampled on the output side of the first high-pass filter stage of the first filter means by a predetermined coefficient greater than 1, and a second value otherwise, and
  control means for
  commanding an increase or a decrease in the gain of the amplifier as a function of the value of the main comparison signal, and
  preventing increase in the gain of the variable gain amplifier if the first auxiliary comparator means deliver their first value, such that
  the electroacoustic system is autostable below the cut-off frequency of the first high-pass filter stage.

14. Device according to claim 9 wherein the cut-off frequency of each first high-pass filter stage is between approximately 150 Hz and approximately 200 Hz and the cut-off frequency of each second high-pass filter stage is between approximately 500 Hz and approximately 2,000 Hz.

15. Device according to claim 14 wherein each of the first and second filter means including a high-pass filter having a slope of approximately 18 dB per octave forming the first high-pass filter stage followed by a high-pass filter having a slope of 6 dB per octave forming the second high-pass filter stage.

16. Device according to claim 9 wherein each auxiliary comparator means includes a comparator, the input of which is connected to the input of the corresponding first high-pass filter stage via a first resistor and to the output of the corresponding first high-pass filter stage via a second resistor, the ratio of the value of the first resistor to the value of the second resistor defining the predetermined coefficient.

17. Device according to claim 9 wherein the predetermined coefficient is between approximately 1.33 and approximately 2.

18. Device according to claim 9 wherein
  the control means include:
    a first transistor for connecting the output of the first processing means to the input of a voltage follower, the output of the voltage follower being connected to the control input of the variable gain amplifier, and the base of the first transistor being connected to the output of each auxiliary comparator means via OR logic gate means, and
    a second transistor connected between ground and the input of the voltage follower, the base of the second transistor being connected to the output of the main comparator means, and wherein
  the comparator means includes a comparator, the input of the comparator being connected to the outputs of the two processing means by first and second resistors of unequal value, the ratio of the values of said resistors defining said safety margin.

19. Device according to claim 9 wherein the first filter means further include an auxiliary high-pass stage on the input side of the first high-pass filter stage, the auxiliary high-pass filter stage having a cut-off frequency less than that of the first high-pass filter stage and the highest possible slope.

20. Device according to claim 18, further including prevention means adapted to prevent increase in the gain of the amplifier in the absence of sound signals or in the presence of a reduction in the wanted signal exceeding a predetermined reduction.

21. Device according to claim 20 wherein the prevention means includes a comparator, the output of the comparator being connected to the base of the first transistor via a diode, the non-inverting input of the diode being connected to the output of a rectifier circuit and the inverting input of the diode being connected, firstly, to ground via a capacitor and, secondly, to the output of the rectifier circuit via a divider resistor bridge and, thirdly, to a power supply via a third resistor whose value is very high in comparison with that of the resistors of the resistive bridge.

22. Device according to claim 9, wherein
  the amplifier has a plurality of input and output channels, and
  the means for acquiring a wanted signal at the amplifier output include discriminator means connected to the output channels of the amplifier, for delivering at all times to an output the signal from the output channel at the highest level.

23. Device according to claim 22 wherein
  the amplifier has a first pair of channels respectively connected to a first pair of loudspeakers and a second pair of channels respectively connected to a second pair of loudspeakers, and
  the discriminator means include:
    four signal inputs respectively connected to the four channels,
    four switch units respectively connecting the four inputs to the output of the discriminator means,
    first discriminator comparator means for comparing the sum of the levels of the channels of the first pair with the sum of the levels of the channels of the second pair, first discriminator control means adapted to open or close the two switches connected to the same pair as a function of the result of a comparison by the first discriminator comparator means, second discriminator comparator means for comparing the sum of the levels of one channel of the first pair and the like channel of the second pair with the sum of the levels of the other channel of the first pair and the like channel of the second pair, and second discriminator control means adapted to open or close one of the two switches not opened by the action of the first discriminator control means.

24. Device according to claim 23 wherein each switch unit includes two transistors having common collectors, the common collectors of the transistors being connected to the corresponding signal input and to the output of the discriminator means, the emitters of the transistors being connected to ground, and the bases of the transistors being connected to respective outputs of the first and second discriminator comparator means.

25. Method according to claim 4, wherein the safety margin is 2 dB.

26. Device according to claim 14 wherein the cut-off frequency of each second high-pass filter stage is 1,000 Hz.

* * * * *